United States Patent
Cao et al.

(10) Patent No.: US 7,746,177 B2
(45) Date of Patent: Jun. 29, 2010

(54) SELF-BIASED BIPOLAR RING-OSCILLATOR PHASE-LOCKED LOOPS WITH WIDE TUNING RANGE

(75) Inventors: Zhiheng Cao, San Diego, CA (US); Robert Floyd Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 12/163,599

(22) Filed: Jun. 27, 2008

(65) Prior Publication Data

US 2009/0322431 A1    Dec. 31, 2009

(51) Int. Cl.
*H03L 7/06* (2006.01)
*H03L 7/08* (2006.01)
*H03L 7/085* (2006.01)
*H03L 7/089* (2006.01)
*H03L 7/093* (2006.01)
*H03L 7/099* (2006.01)

(52) U.S. Cl. .............................. 331/1 A; 331/8; 331/17; 331/25

(58) Field of Classification Search ................ 331/1 A, 331/8, 16–18, 25, 34, 57, 177 R
See application file for complete search history.

(56) References Cited

U.S. PATENT DOCUMENTS

2006/0012442 A1 *  1/2006  Shinbo et al. .................. 331/17

OTHER PUBLICATIONS

Maneatis et al., "Phase-Locked Loops Demystified," Chip Estimate IP Connections Newsletter, True Circuits, Inc., Aug. 28, 2007, 4 pages.

Maneatis et al., "Self-Biased High-Bandwidth Low-Jitter 1-to-4096 Multiplier Clock Generator PLL," IEEE Journal of Solid-State Circuits, Nov. 2003, 9 pages, p. 1795-1803, vol. 38, No. 11.

Maneatis, John G., "Low-Jitter Process-Independent DLL and PLL Based on Self-Biased Techniques," IEEE Journal of Solid-State Circuits, Nov. 1996, 10 pages, p. 1723-1732, vol. 31, No. 11.

Gilbert, Barrie, "The Multi-Tanh Principle: A Tutorial Overview," IEEE Journal of Solid-State Cicuits, pp. 2-17, Jan. 1998, vol. 33, No. 1.

* cited by examiner

*Primary Examiner*—David Mis
(74) *Attorney, Agent, or Firm*—John J. Patti; Wade J. Brady, III; Frederick J. Telecky, Jr.

(57) ABSTRACT

Self-biased bipolar ring-oscillator phase-locked loops with a wide tuning range are disclosed. In a particular example, an apparatus to provide a phase-locked loop is described, comprising a voltage-controlled oscillator (VCO) to provide an output clock signal having a frequency, a quantizer, a phase-frequency detector to generate an adjustment signal, and a charge pump to modify the control voltage. The example VCO includes several ring-oscillator stages, where each ring-oscillator stage includes several gain stages to provide several output currents based on a comparison of a control voltage and several corresponding threshold voltages. The example quantizer includes several comparators to generate digital signals based on the output currents. The example charge pump modifies the control voltage based on the digital signals and the adjustment signal, and includes several switching elements to increase or decrease current to the charge pump based on the digital signals.

25 Claims, 9 Drawing Sheets

SELF-BIASED BIPOLAR RING-OSCILLATOR PHASE-LOCKED LOOPS WITH WIDE TUNING RANGE

FIELD OF THE DISCLOSURE

This disclosure relates generally to phase-locked loop circuits and, more particularly, to self-biased bipolar ring-oscillator phase-locked loops with wide tuning range.

BACKGROUND

Phase-locked loop (PLL) circuits are used to generate clock signals having a fixed phase relationship with respect to a reference clock signal. Typical phase-locked loop circuits include a voltage-controlled oscillator (VCO), a loop filter, and a phase-frequency detector. The VCO generates a clock signal having a frequency that varies based on a control voltage, and the phase-frequency detector adjusts the control voltage via the loop filter based on a comparison of the phase relationship of the clock signal and the reference clock signal.

One type of VCO is a ring-oscillator VCO, in which an odd number of ring-oscillator stages are connected in series. Each stage inverts an input signal provided by a prior stage and passes the inverted input signal to a next ring-oscillator stage. The final ring-oscillator stage has an output signal that is provided as a clock signal and that is fed back to the input of the first ring-oscillator stage to form a loop. Due to alternating input voltages and gate delay, the clock signal from the ring-oscillator has a predictable frequency that is generally proportional to an input control voltage. In existing ring-oscillator VCO circuits, gain stages in each ring-oscillator stage function the same way, resulting in VCO circuits with limited tuning range and nonlinear frequency-control voltage relationships, which are undesirable features for a PLL circuit.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example methods and apparatus, persons of ordinary skill in the art will readily appreciate that the examples are not the only way to implement such apparatus.

As used herein, the notation SIGNAL<X:Y> denotes a range signals having similar purposes, origins, and/or destinations. The signals in the range SIGNAL<X:Y> are numbered starting at Y (typically 0) and increasing to X. Signals may be voltages or currents, and the signal values may be static, substantially static, or dynamic. The notation SIGNAL<A> refers to a particular signal in the signal range SIGNAL<X:Y>.

The example apparatus described herein may be used to provide a self-biased bipolar ring-oscillator phase-locked loop (PLL) circuit with a wide tuning range and improved linearity. In one particular example, a voltage-controlled oscillator (VCO) provides an output clock having a frequency based on a control voltage. The example VCO includes biasing circuitry and a resistor ladder to provide threshold voltages to three ring-oscillator stages, each ring-oscillator stage having nine gain stages. Each gain stage generates an output current (i.e., turns on) based on a comparison of the control voltage and one of the reference voltages, such that as the control voltage increases from a ground reference voltage, more gain stages will turn on as the control voltage increases above the corresponding threshold voltages, until all of the gain stages are on. In contrast to the gain stages of prior ring-oscillator circuits that share the same control voltage and have identical delays, the example gain stages described below output currents based on a comparison of a control voltage and a corresponding threshold voltage, such that the threshold voltage is different for each gain stage.

The example PLL circuit is also self-biasing. That is, the PLL circuit scales the bandwidth of a loop filter based on the output clock frequency. To this end, comparators in a quantizer receive control currents from corresponding gain stages of one of the ring-oscillator stages, and generate digital signals from the polarities of the control currents. The digital signals are used to modify the resistance value of the RC loop filter in response to the output clock frequency. The digital signals are also used in a charge pump current generator, which generates a current for a charge pump proportional to the number of digital signals that are on via a large number of individually-controlled smaller current generators. The charge pump currents allow the charge pump to more precisely match frequency tuning signals from a phase-frequency detector. Matching the frequency tuning signal currents allows for greater PLL loop stability (e.g., lowering jitter and/or noise, optimizing closed-loop bandwidth and/or damping factor).

Figure 1:
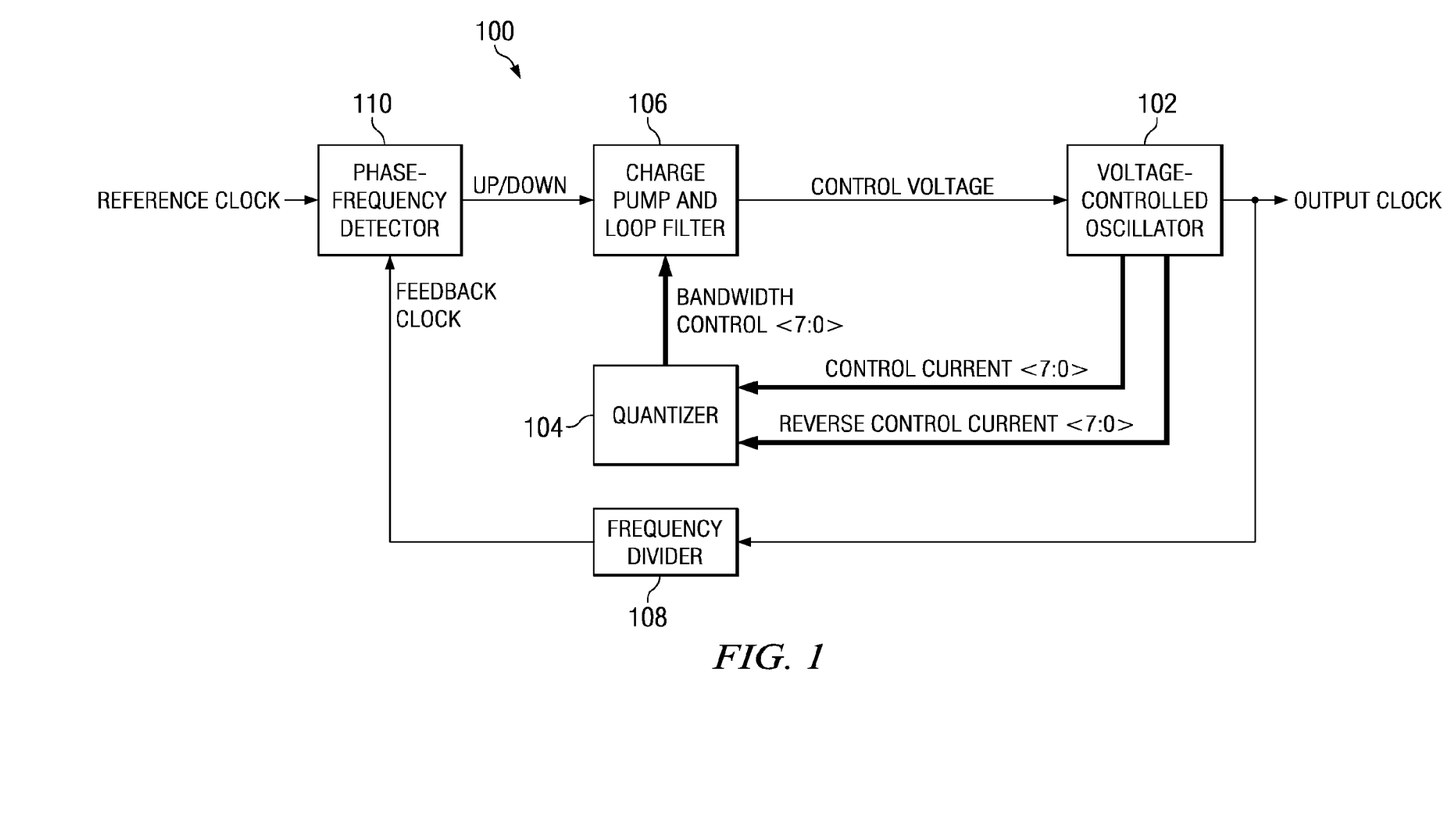
FIG. 1 is a block diagram of an example self-biased bipolar ring-oscillator phase-locked loop circuit.

FIG. 1 is a block diagram of an example self-biased bipolar ring-oscillator PLL circuit 100. The example PLL circuit 100 includes a VCO 102, a quantizer 104, a charge pump/loop filter 106, a frequency divider 108, and a phase-frequency detector 110. The VCO 102 receives a control voltage, outputs a clock signal having a frequency based at least in part on the control voltage, and outputs control currents representative of the control voltage. The control currents are shown as a bus, with 8 distinct current signals <7:0> and 8 corresponding reverse current signals <7:0>. The control currents <7:0> are sent to the quantizer 104, which generates digital bandwidth control signals <7:0> based on the corresponding control currents <7:0>.

The output clock signal is sent to the phase-frequency detector 110 as a feedback clock signal. The feedback clock signal may also be generated by the frequency divider 108, such that the frequency of the feedback clock signal is determined by dividing the output clock signal frequency by a dividing factor.

The frequency divider 108 may be any frequency divider circuit that receives an input clock and outputs a feedback clock based on the input clock and a dividing factor. The dividing factor may be fixed, variable, and/or programmable, or the frequency divider may be omitted to couple the output clock directly to the phase-frequency detector 110. The phase-frequency detector 110 outputs digital adjustment signals UP, DN, UPZ, and DNZ, the uses of which are discussed in detail below in connection with FIG. 8.

The bandwidth control signals are sent to the charge pump/loop filter 106 to provide charge pump current and PLL bandwidth control. The charge pump/loop filter 106 adjusts the control voltage based on the bandwidth control signals and digital adjustment signals from the phase-frequency detector 110. The phase-frequency detector 110 generates the adjustment signals from a comparison (e.g., of a phase relationship) of a reference clock and the feedback clock signal. The choice of the dividing factor of the frequency divider 108 may be based on the desired relationship between the output clock signal frequency and the reference clock.

Figure 2:
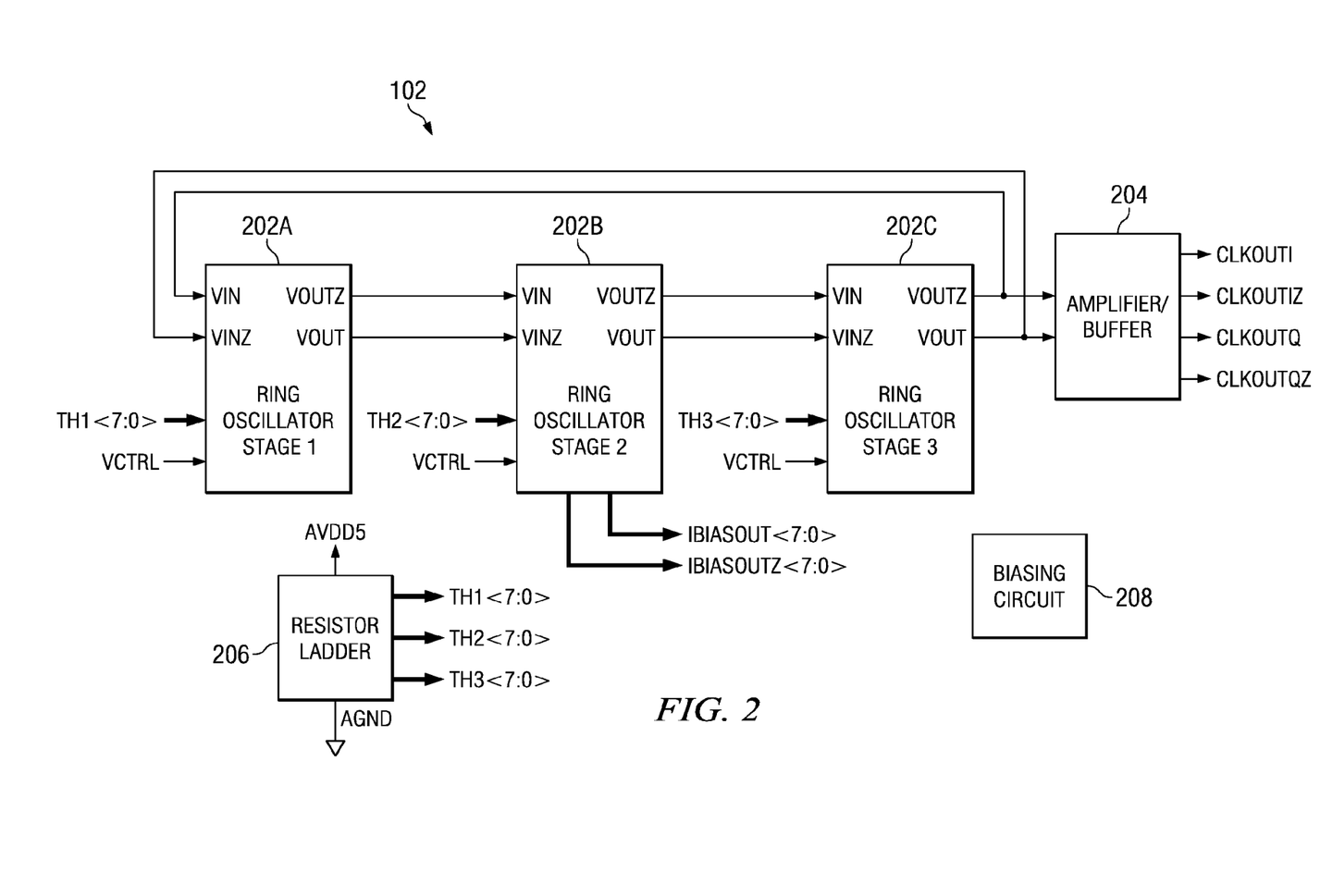
FIG. 2 is a block diagram of the example voltage-controlled oscillator circuit of FIG. 1.

It should be further recognized that various implementations of the PLL circuit 100 may include any appropriate number of control currents and/or digital signals to represent the approximate value of VCTRL to the quantizer 104, charge pump/loop filter 106, and/or ring-oscillator stage(s) 202A-C. Alternative implementations and modifications within the scope of this disclosure will be apparent to those of ordinary skill in the art, according to the examples described herein.

FIG. 2 is a block diagram of the example voltage-controlled oscillator circuit 102 of FIG. 1. The VCO circuit 102 may be used to produce one or more output clock signals (e.g., in-phase clock CLKOUTI, quadrature clock CLKOUTQ, and respective 180°-phase shifted clocks CLKOUTIZ and/or CLKOUTQZ) having a frequency based on a voltage level of the control voltage (VCTRL). The example VCO circuit 102 includes three ring-oscillator stages 202A-C, an amplifier and/or buffer circuit 204, a resistor ladder 206, and a biasing circuit 208. To produce the output clock signals, each ring-oscillator stage 202A-C receives an input signal and outputs a logical inversion of the input signal to the next stage. The final ring oscillator stage 202C outputs the clock signal to the amplifier/buffer 204 and also feeds the clock signal back to the first ring-oscillator stage 202A. The ring-oscillator stages 202A-C iterate the feedback loop to generate a continuous clock signal.

The frequency of the output clock signal increases as VCTRL increases. VCTRL is input to each ring-oscillator stage 202A-C, the outputs (e.g., output currents) of which are directly correlated with VCTRL. As the outputs increase, transistor capacitances that cause gate delays in the ring-oscillator stages 202A-C are overcome more quickly, resulting in faster signal inversion at each ring-oscillator stage 202A-C. Thus, the oscillation frequency of the output clock signal increases as VCTRL increases ($\Delta f_{osc}/\Delta VCTRL$).

Each ring-oscillator stage 202A-C in the example VCO 102 receives a set of threshold signals (e.g., TH1, TH2, and TH3, respectively) provided by the resistor ladder 206. As described in detail below in connection with FIG. 4, the threshold signals are substantially constant voltages that provide a series of voltage steps to the ring-oscillator stages 202A-C. The ring-oscillator stage 202A-C compares VCTRL to each threshold signal, and the output clock frequencies are adjusted accordingly. In the example of FIG. 2, the threshold voltages increase in substantially equal steps, where TH3<0> is the lowest threshold voltage, TH2<0> is the next lowest threshold voltage, followed by TH1<0>, TH3<1>, etc., up to the highest threshold voltage TH1<7>.

The ring-oscillator stage 2 202B outputs several control current signals IBIASOUT<7:0>, which correspond to a comparison between VCTRL and TH2<7:0> as described in more detail below. The current signals IBIASOUT<7:0> (and corresponding reverse control current signals IBIASOUTZ<7:0>) are used by the quantizer 104 of FIG. 1 as control currents, which, as a whole, provide an estimate of the frequency of the output clocks for a self-biasing function of the PLL 100.

The biasing circuit 208 provides bias voltages and currents to bipolar transistors in the VCO 102 (shown in FIG. 1), such that the circuits are active and all bipolar transistors do not saturate, as saturation causes significant delays in the operation of the VCO 102 and may prevent high output clock frequencies.

Although three ring-oscillator stages 202A-C are shown in the example of FIG. 2, more ring-oscillator stages may be used based on the desired output clock frequencies. For a given VCTRL, as the number of ring-oscillator stages increases, the output clock frequency decreases. Additionally, the example IBIASOUT is output to the quantizer 104 from the ring-oscillator stage 2 202B to approximate the value of VCTRL (i.e., to approximate the frequency of CLKOUTI). However, the IBIASOUT of 202A and/or 202C may be input to the quantizer 104 in addition to or as an alternative to the example if other bandwidth control is desired.

Figure 3:
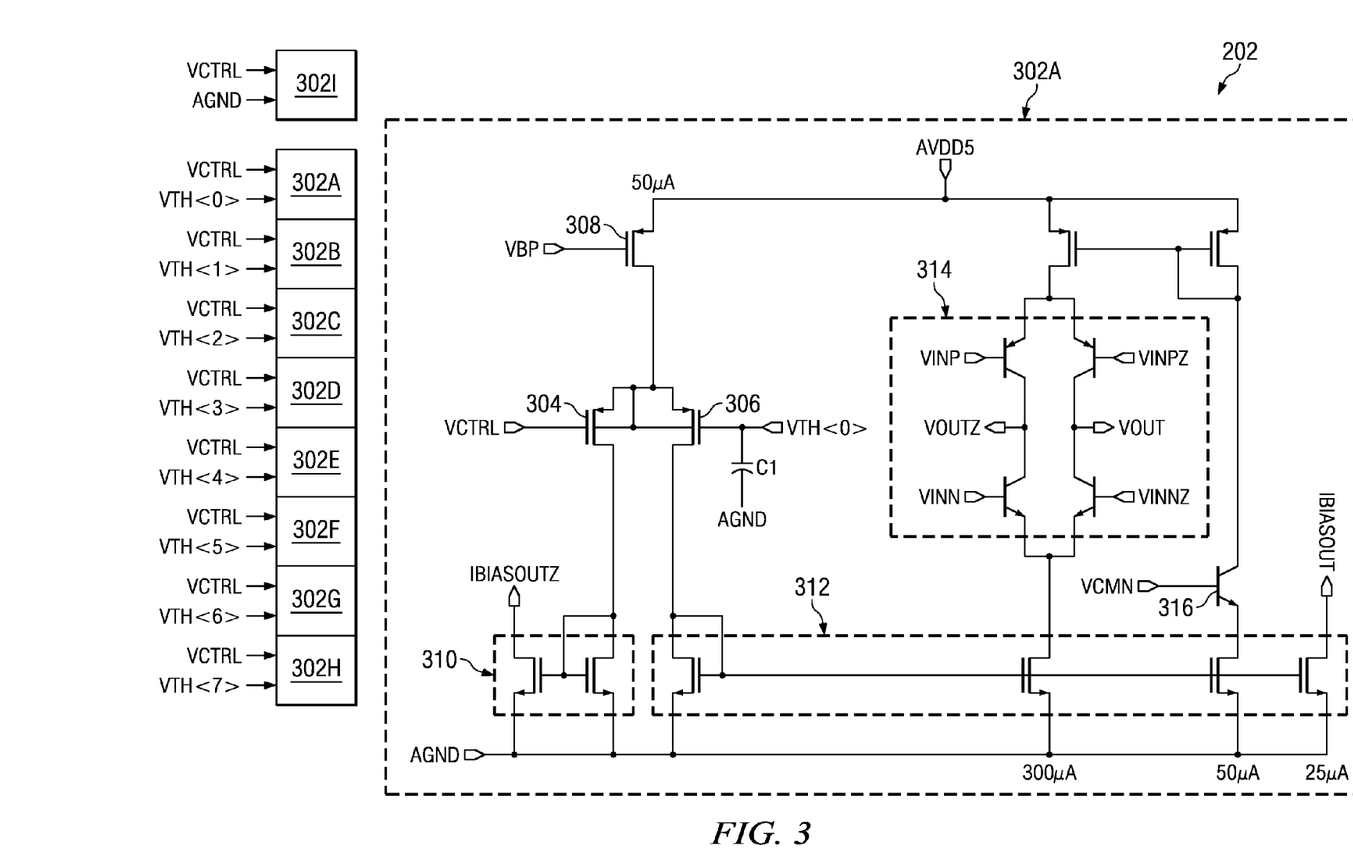
FIG. 3 is a diagram of an example ring-oscillator stage used in the example voltage controlled oscillator circuit of FIG. 2.

FIG. 3 is a diagram of an example ring-oscillator stage 202 used in the example voltage controlled oscillator circuit 102 of FIG. 2. The ring-oscillator stage 202 includes nine gain stages 302A-I. Each gain stage 302A-I may selectively contribute currents to the outputs VOUT and VOUTZ of the ring-oscillator stage 202 and also provide an output current signal, based on a comparison of VCTRL and a corresponding threshold voltage (VTH). The threshold voltages VTH for the gain stages 302A-I are evenly distributed along a desired range of control voltage so that at least one gain stage 302A-I in at least one ring-oscillator stage 202A-C has an output current that is operating linearly with respect to VCTRL (i.e., the outputs of the gain stage are not fully on or fully off).

The example gain stages 302A-I are identical in topology and output identical maximum currents. However, any or all of the gain stages 302A-I may be configured to have different maximum currents based on the implementation and/or to improve linearity. The gain stage 302I is generally always on while the PLL 100 is operating, as the threshold voltage is at AGND, or the ground reference of the circuit, so VCTRL is at a higher voltage than the threshold voltage for the gain stage 302I.

A schematic diagram of 302A is also shown in FIG. 3. In the example gain stage 302A (and the other gain stages 302B-I), VCTRL and VTH (e.g., VTH<0>) are input to gate terminals of respective differential p-type transistors 304 and 306. The transistors 304 and 306 are configured such that very small differences in voltage between VCTRL and VTH will cause more current from a current source (e.g., the p-type transistor 308) to be diverted to the transistor 304 or 306 having the lower gate voltage. Thus, while VCTRL is below VTH, the transistor 304 will be on, or conducting, more than the transistor 306. This causes a current mirror 310 to conduct the current flowing through the transistor 304, which causes an output terminal IBIASOUTZ to output a current identical or substantially identical to the current flowing through the transistor 304.

Due to the transistor 306 conducting less current (relative to a higher VCTRL), a current mirror 312 also reduces conduction or turns off, reducing the current that is output from the terminal IBIASOUT. Thus, when VCTRL is lower than VTH for a particular gain stage, the terminal IBIASOUTZ sinks more current than the terminal IBIASOUT. In contrast, when VCTRL is higher than VTH for the gain stage, the terminal IBIASOUT sinks more current than the terminal IBIASOUTZ. When VCTRL is far enough below VTH, the transistor 304 will be fully on and the transistor 306 will be fully off (i.e., the gain stage 302A will be fully off). In contrast, when VCTRL is high enough above VTH, the transistor 306 will be fully on and the transistor 304 will be fully off (i.e., the gain stage 302A will be fully on). If the gain stage 302A is neither saturated nor cut off, the gain stage 302A will be operating linearly, and the current available at the terminals VOUT and VOUTZ will increase linearly with VCTTRL. Similarly, the difference between the current outputs at IBIASOUT and IBIASOUTZ will increase linearly.

As VCTRL increases, the gain stages will progress from cut off, through linear mode, and then saturate as the next gain stage having a higher VTH enters linear mode. For example, when VCTRL increases so as to saturate the gain stage 302A in ring-oscillator stage 202C (VTH3<0>), the gain stage 302A in ring-oscillator stage 202B (VTH2<0>) will enter linear mode from cut off. Thus, at least one gain stage 302A-I of the ring-oscillator stages 202A-C will be operating in linear mode for all VCTRL, providing a substantially linear $\Delta f_{osc}/\Delta VCTRL$.

Furthermore, when VCTRL is at a lower voltage than VTH, the restricted current in the current mirror 312 restricts the current flowing through a differential amplifier 314. Signals (e.g., current signals) at differential amplifier output terminals VOUT and VOUTZ are summed with VOUT and VOUTZ signals from the rest of the gain stages 302B-I to generate the ring-oscillator stage VOUT and VOUTZ signals shown in FIG. 2. As a result, the VOUT and VOUTZ signals at each gain stage 302A-I are on when VCTRL is higher than VTH for that particular gain stage 302A-I and, thus, increase the summed ring-oscillator output signals VOUT and VOUTZ. Generation of input signals (e.g., current signals) VINP, VINPZ, VINN, and VINNZ to the differential amplifier 314 are described below in connection with FIG. 6.

An n-type transistor 316 is included to control a bias current to the differential amplifier 314. Due to the current mirror 312, the bias current affects the differential amplifier 314 when VCTRL is higher than VTH. The transistor 316 is controlled by a bias signal VCMN, the generation of which is described below in connection with FIG. 5.

A capacitor C1 provides filtering of the threshold voltage signal VTH in case of any transient voltages on the AVDD5 power source.

Although the example ring-oscillator stage 202 is shown with nine gain stages, it is easily recognized by those of ordinary skill in the art to modify the ring-oscillator stage 202 to have any number of gain stages, with a corresponding number of threshold voltages. A larger number of gain stages 302 per ring-oscillator stage 202 may provide more linear frequency tuning in the VCO with respect to VCTRL, but increases circuit size and complexity. Similarly, a smaller number of gain stages 302 with respect to the number shown in FIG. 3 may provide less circuit complexity at the expense of frequency tuning linearity.

Figure 4:
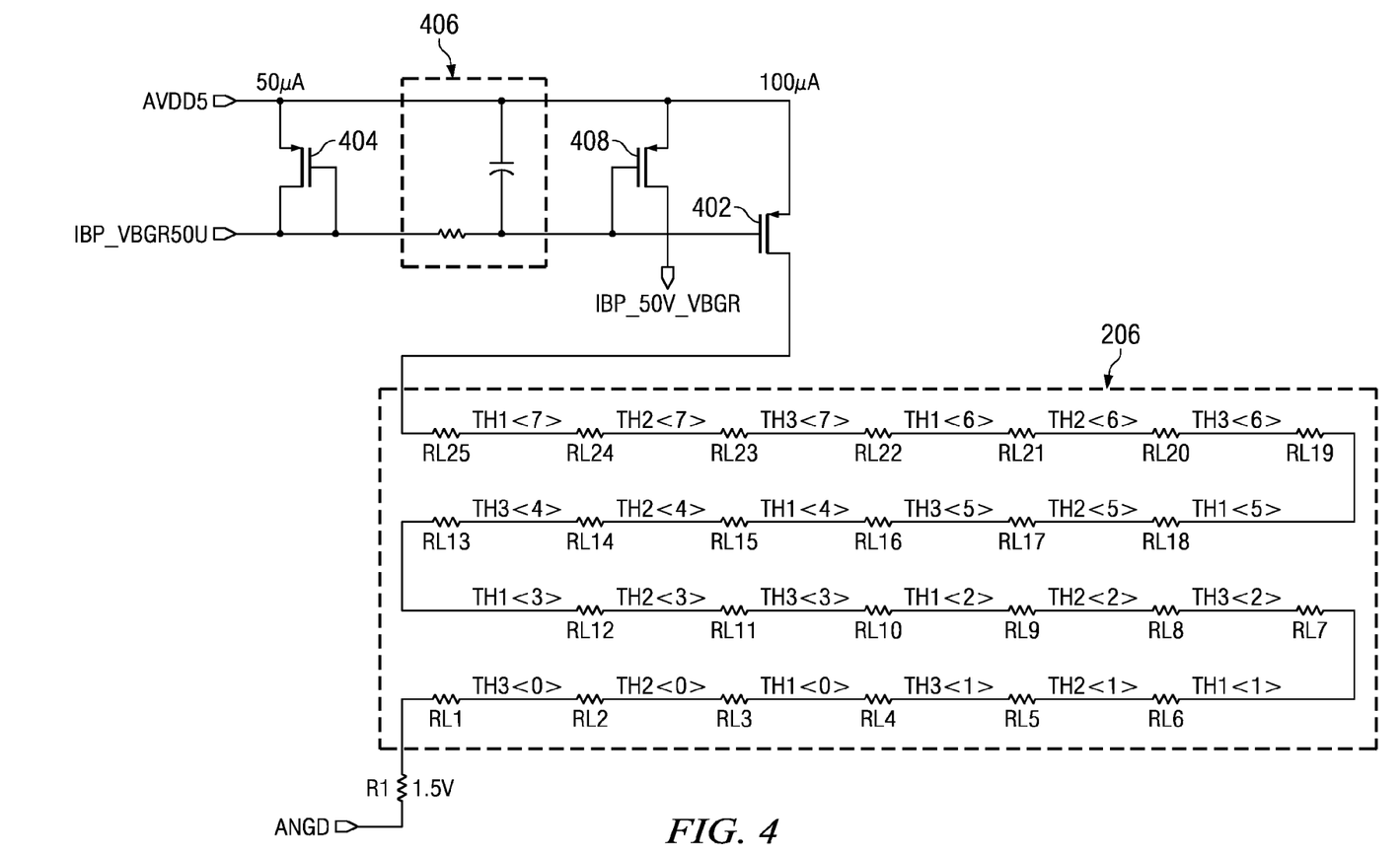
FIG. 4 is a schematic diagram of an example resistor ladder to provide threshold voltages in the voltage controlled oscillator circuit of FIG. 2.

FIG. 4 is a schematic diagram of an example resistor ladder 206 to provide threshold voltages in the voltage controlled oscillator circuit 102 of FIG. 2. A series of resistors RL1-RL25 and a controlled current provide the threshold voltages VTH1, VTH2, and VTH3 described above in connection with FIGS. 2 and 3. A 50 µA bias current IBP_VBGR50U is applied to a gate terminal of a p-type transistor 402 to control the current flowing through the resistors and, thus, the voltages between each resistor. A diode-connected p-type transistor 404 and an RC filter 406 keep the bias current at a particular voltage and reduce any noise, which may help keep a constant current level through the resistor ladder 206. A second current IBP_50U_VBGR is generated by a p-type transistor 408, having substantially the same current as the current in the resistor ladder 206. The current IBP_50U_VBGR provides a bias current to the charge pump current generator circuit 800 described below in connection with FIG. 8.

Each resistor of the example resistor ladder 206 has equal or substantially equal resistance values, which creates equal or substantially equal voltage steps between each resistor. As a result, constant or substantially constant $\Delta f_{osc}/\Delta VCTRL$ may be obtained. A resistor R1 may be used to create an offset voltage so the lowest threshold voltage may be at a particular offset (e.g., a minimum VCTRL). Alternatively, any or all of the resistors in the resistor ladder 206 may have different resistance values to improve the linearity of the oscillation frequency with respect to VCTRL.

Figure 5:
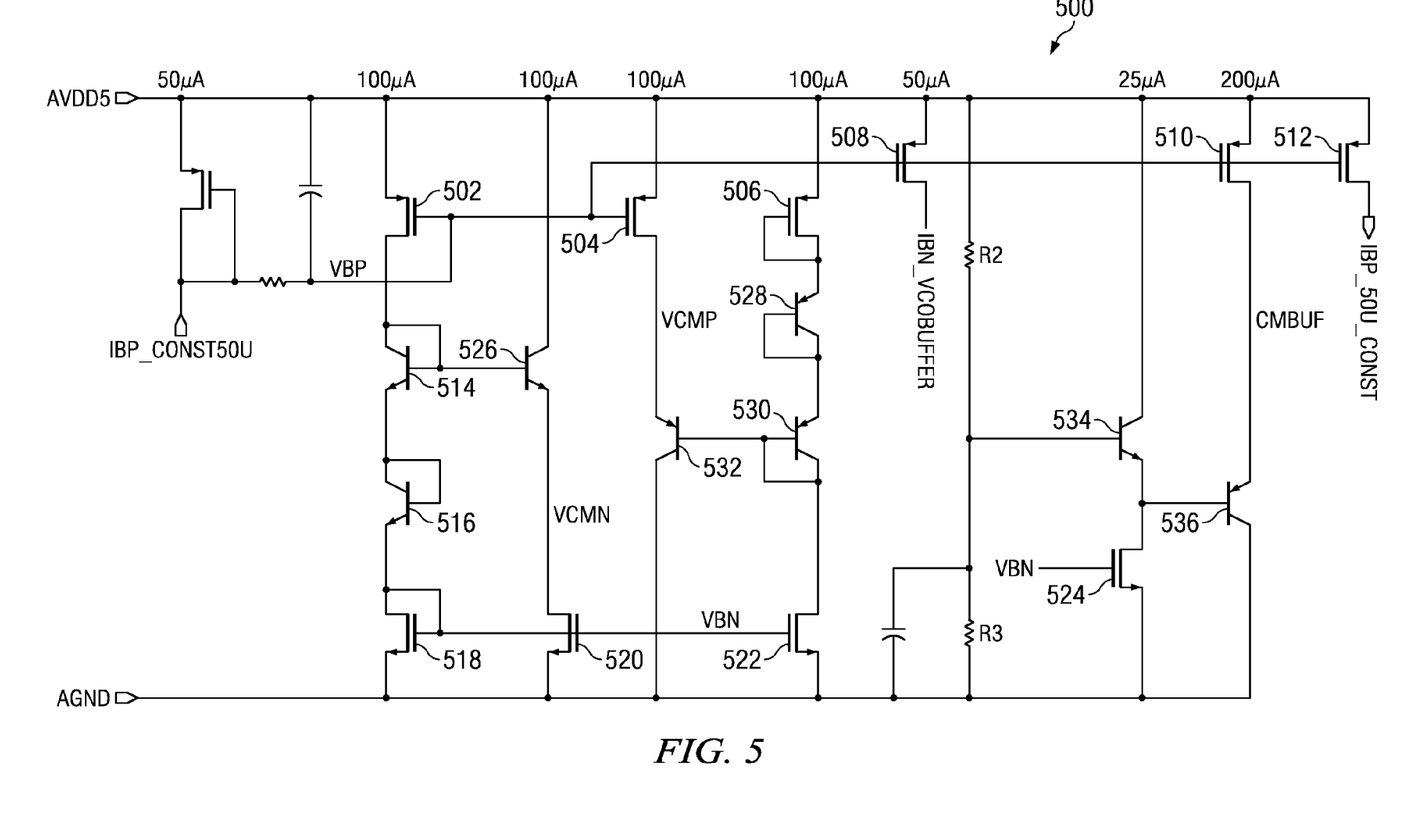
FIG. 5 is a schematic diagram of an example circuit to provide bias voltages to the phase-locked loop circuit of FIG. 1.

FIG. 5 is a schematic diagram of an example bias circuit 500 to provide bias voltages to the phase-locked loop circuit 100 of FIG. 1. The bias circuit 500 may be implemented as the example bias circuit 208 described in FIG. 2. A constant bias current IBP_CONST50U is input to the circuit 500, which creates a high-side bias voltage VBP. The bias voltage VBP is used to control gate terminals of p-type transistors 502-512. The transistor 502 conducts a current via diode-connected NPN transistors 514 and 516 to a gate terminal of n-type transistors 518-524, which is used as a bias voltage VBN. A bias voltage VCMN may be derived from a drain terminal of the transistor 520, which is a base-emitter junction voltage lower than a base terminal of the transistor 526 (and 514).

The example bias voltage VBN creates an additional bias voltage VCMP in a similar manner as VBP creates VCMN. That is, VBN causes the transistor 522 to conduct a current flowing from AVDD5 to AGND via the transistor 506, PNP transistors 528 and 530, and the transistor 522. VCMP may be derived from a base-emitter junction voltage above the voltage at a base terminal of a PNP transistor 532.

An additional bias voltage CMBUF is generated by the example circuit 500 to have approximately the mean voltage of AVDD5 and AGND. Two resistors R2 and R3 have equal or substantially equal resistance values and are connected in series between AVDD5 and AGND. Thus, the voltage at a node between the two resistors R2 and R3 is the mean voltage of AVDD5 and AGND. An NPN transistor 534 provides a base-emitter junction voltage drop from the R2/R3 node to a base terminal of a PNP transistor 536, which provides a base-emitter junction voltage increase to generate CMBUF.

Figure 6:
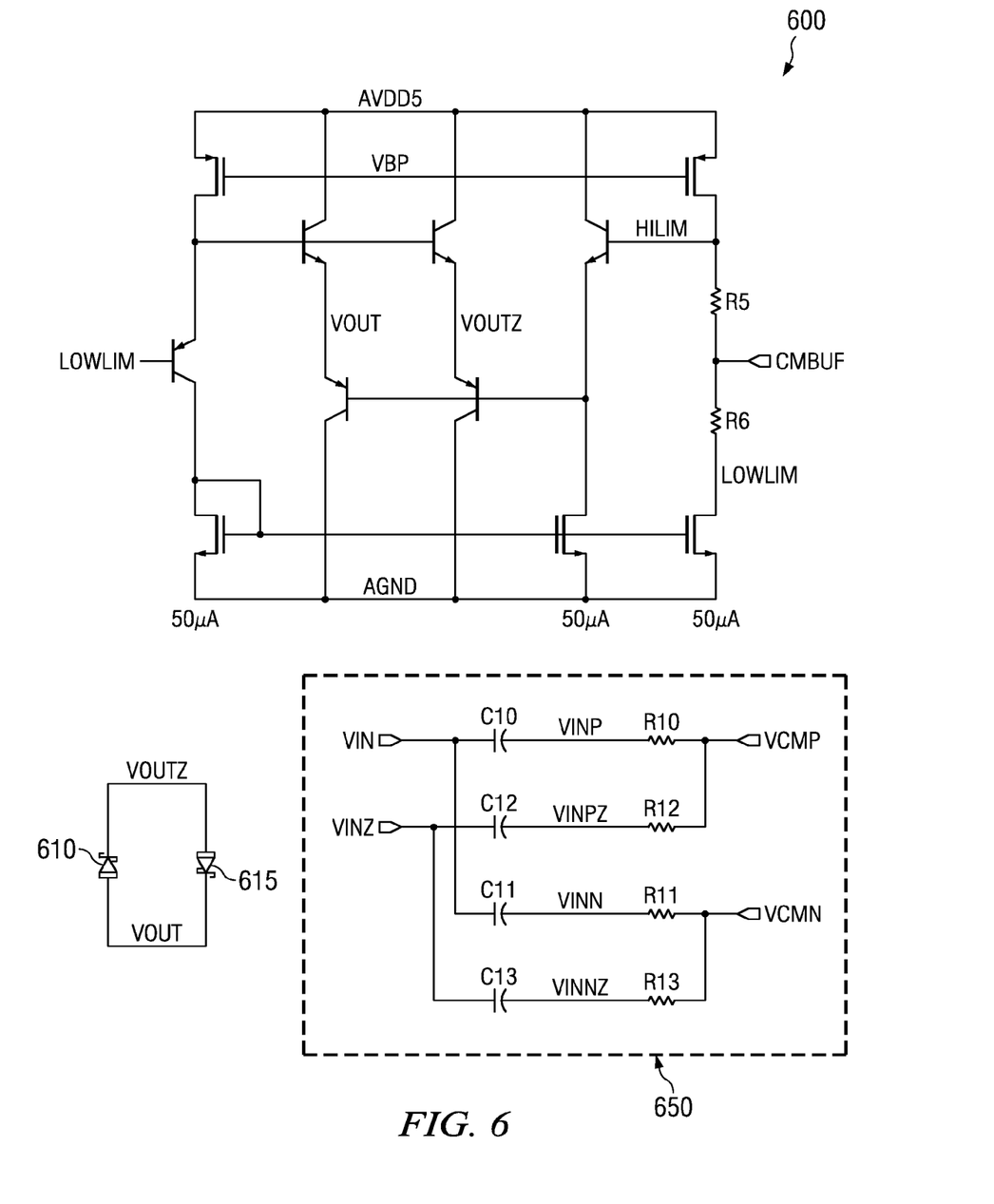
FIG. 6 is a schematic diagram of an example clamping circuit to clamp the output voltages shown in FIGS. 2 and 3 to the common mode voltage shown in FIG. 5.

FIG. 6 is a schematic diagram of an example clamping circuit 600 to clamp the output voltages VOUT and VOUTZ shown in FIGS. 2 and 3 to voltages centered on the common mode voltage CMBUF shown in FIG. 5. The clamping circuit 600 prevents VOUT and VOUTZ from increasing in voltage above a high voltage limit HILIM, or decreasing in voltage below a low voltage limit LOWLIM. The bias voltage VBP generates a current that flows through resistors R6 and R7, generating HILIM and LOWLIM from the voltage CMBUF described in FIG. 5. By clamping VOUT and VOUTZ to CMBUF, the clamping circuit 600 prevents the transistors in the gain stages 302A-I from entering saturation, which can substantially decrease the oscillation frequency.

Although an example clamping circuit 600 is shown, it should be readily recognized that any clamping circuit may be used to prevent the voltages at VOUT and VOUTZ from becoming too high or too low relative to CMBUF.

Differential mode clipping diodes 610 and 615 prevent excessive signal swing at VOUT and VOUTZ. The clipping diodes 610 and 615 may also absorb any mismatch currents of the n-type and p-type current sources (i.e., transistors) in the gain stages 302A-I.

An AC coupling circuit 650 provides differential signals VINP, VINPZ, VINN, VINNZ to the example gain stages 302A-H of FIG. 3. The VIN and VINZ signals, which are input to the example ring-oscillator stage 202B described in FIGS. 2 and 3, are AC coupled to the bias voltages VCMP and VCMN by the coupling capacitors C10-C13 and resistors R10-R13. The differential signals VINP, VINPZ, VINN, and VINNZ are used to generate VOUT and VOUTZ in the gain stages 302A-I as described above in connection with FIG. 3.

Figure 7:
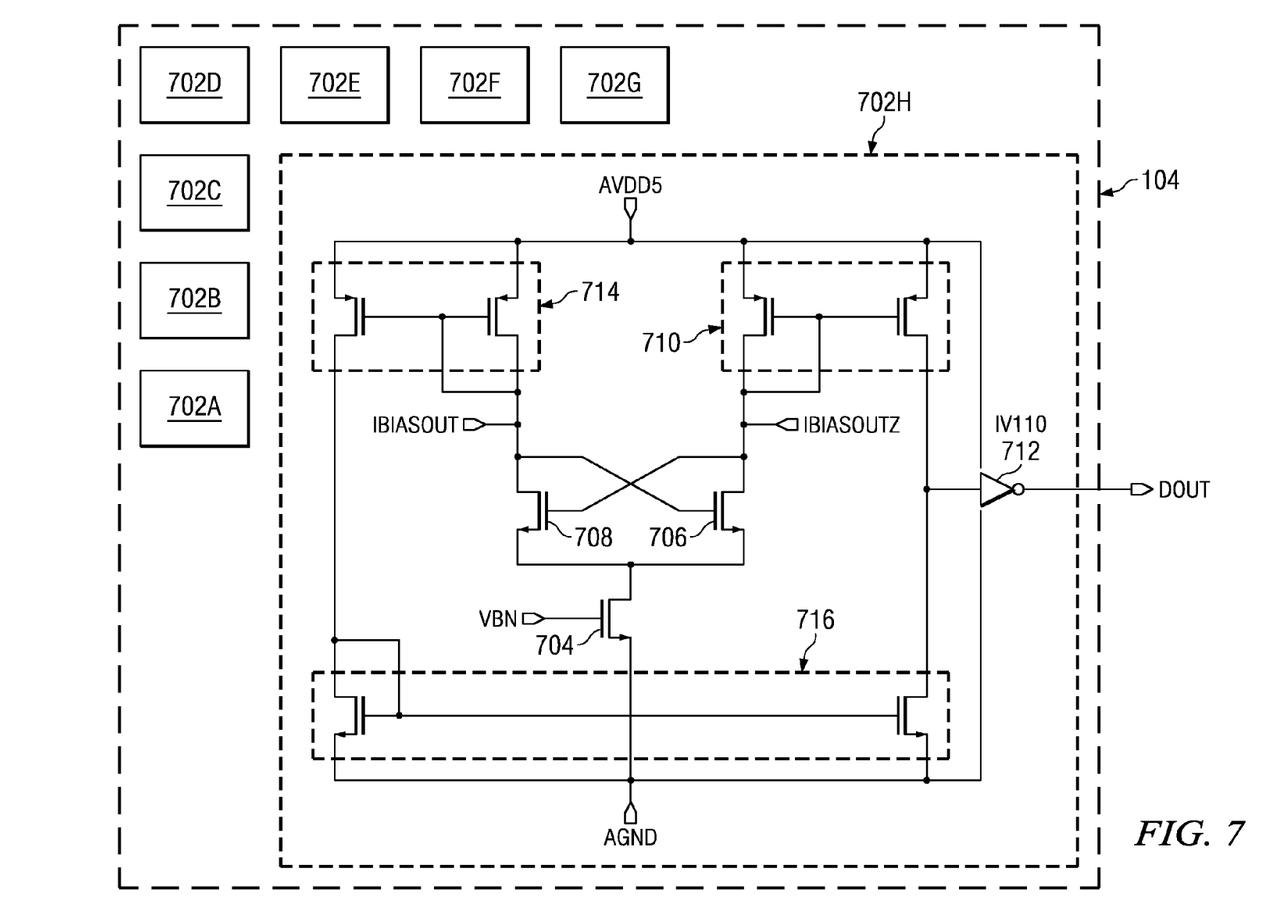
FIG. 7 is a diagram of the example quantizer circuit shown in FIG. 1.

FIG. 7 is a diagram of the example quantizer circuit 104 of FIG. 1. The example quantizer 104 includes eight identical comparators 702A-H. The comparator 702H is shown in greater detail to illustrate its operation. Each comparator 702A-H receives two current inputs IBIASOUT and IBIASOUTZ, which are generated by the example ring-oscillator stage 2 202B (i.e., the gain stages 302A-H) described in FIGS. 2 and 3. Each comparator 702A-H generates a logical output DOUT based on a comparison of the input currents.

In an example, the current pulled from IBIASOUTZ is greater than the current pulled from IBIASOUT (i.e., VCTRL is lower than VTH in the corresponding gain stage as described above). The bias voltage VBN is used at a gate terminal of an n-type transistor 704 to establish a current flow through the transistor 704. The current must also flow through the n-type transistors 706 and/or 708, which have IBIASOUT and IBIASOUTZ coupled to a respective gate terminal of each transistor. Due to the higher at IBIASOUTZ with respect to IBIASOUT, the transistor 706 conducts more current than the transistor 708. The current through the transistor 706 causes increased current to flow through a p-type current mirror 710, which causes an input terminal to an inverter gate 712 to increase in voltage to a logical high. As a result, the NOT gate 712 outputs a logical low from the comparator 702H at DOUT.

In another example, the current pulled from IBIASOUTZ is at a lower voltage than IBIASOUT (i.e., VCTRL is higher than VTH in the corresponding gain stage). The smaller current at IBIASOUTZ turns on the n-type transistor 708 with respect to the transistor 706, causing current to flow through the transistor 708 via a p-type transistor current mirror 714. The current mirror 714 further causes current to flow through an n-type current mirror 716, which results in the voltage at the input terminal of the inverter gate 712 to fall to a logical low. As a result, the output DOUT of the comparator 702H is a logical high.

Figure 8:
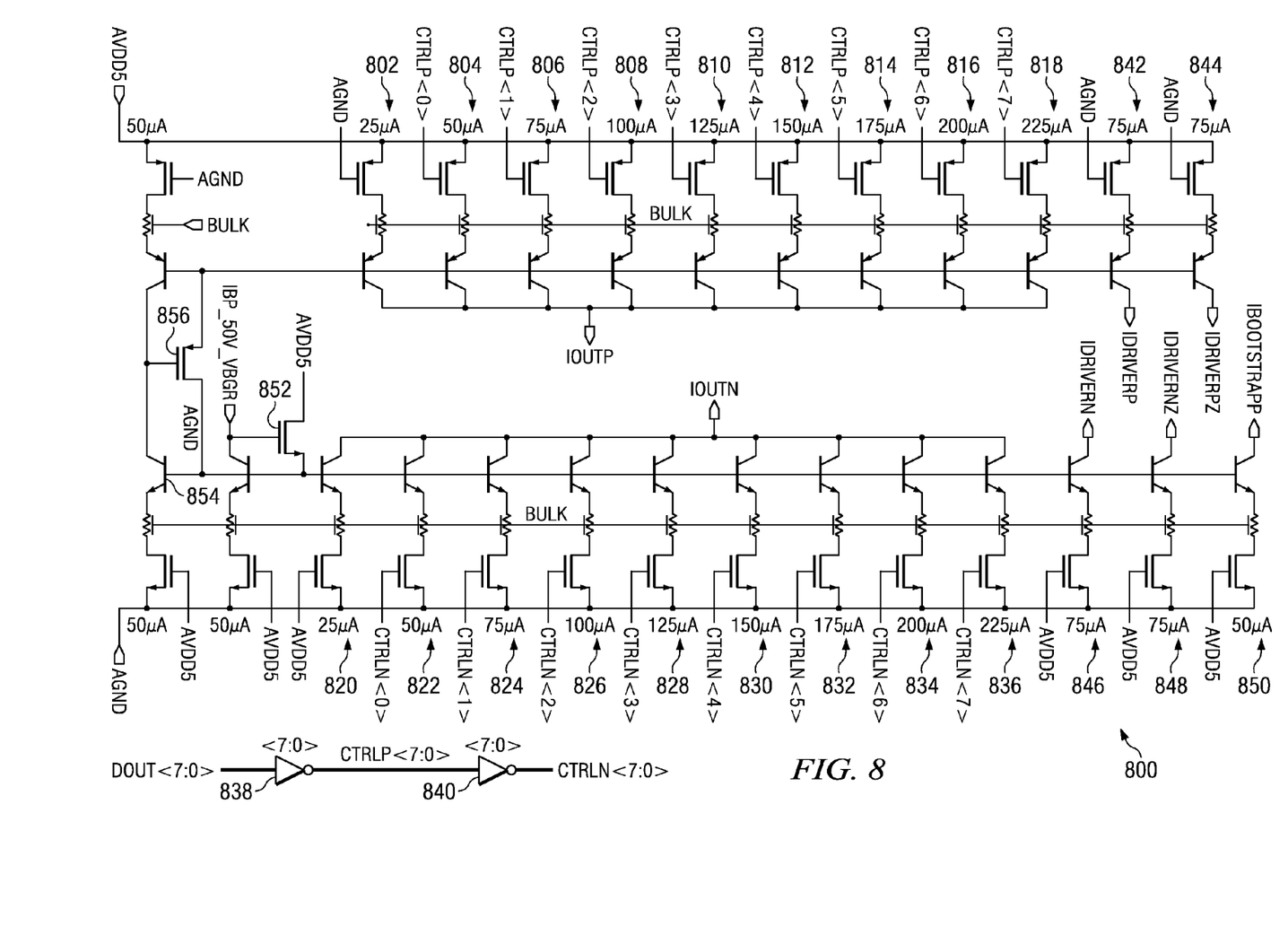
FIG. 8 is a schematic diagram of an example charge pump current generator for the charge pump and loop filter shown in FIG. 1.

FIG. 8 is a schematic diagram of an example charge pump current generator 800 for the charge pump and loop filter 106 shown in FIG. 1. The charge pump current generator 800 includes multiple branches, at a high side (branches 802-818) to control the current flowing into a charge pump (e.g., the charge pump 800 described below in connection with FIG. 9) and at a low side (branches 820-836) to control the current flowing from the charge pump 800. The high side branches 802-818 each include a p-type transistor, a resistive element, and a PNP transistor that is biased to permit a current flow. The low side branches 820-836 each include an n-type transistor, a resistive element, and an NPN transistor that is biased to permit a current flow.

The high side and low side branches 802-836 have designated current limits as shown in FIG. 8. For example, the high side branch 802 and the low side branch 820 may each conduct 25 µA of current. The high side branch 804 and the low side branch 822 may each conduct 50 µA, and so forth up to high side branch 818 and low side branch 836. In operation, the high side branch 804 will begin conducting at or before the time the branch 802 reaches peak current.

Further, each example high side branch 802-818 may be constructed using multiple smaller current branches. For example, the high side branch 804 is implemented using two parallel 25 µA high side branches, the high side branch 806 is implemented using three parallel 25 µA high side branches, etc.

Each p-type transistor and n-type transistor is turned on or off by respective logical signals CTRLP<7:0> and CTRLN<7:0> based on the DOUT<7:0> signals received from the quantizer 104. Each DOUT<7:0> signal is received and input to a first inverter gate 838. The outputs of the first inverter gates 838<7:0> are used as CTRLP<7:0> signals and are input to second inverter gates 840<7:0>. The outputs of the inverter gates 840<7:0> are used as CTRLN<7:0> signals. The p-type transistors in the high side branch 804 utilize CTRLP<0> as a control signal, the p-type transistors in the high side branch 806 utilize CTRLP<1> as a control signal, etc. The p-type transistor in the branch 802 utilizes AGND as a control signal, and is always conducting current while the circuit is in operation. Similarly, the n-type transistors in the low side branch 836 utilize CTRLN<7> as a control signal, and so forth. The low side branch 820 utilizes AVDD5 for a control signal and is always conducting current.

Currents flowing through the high side branches 802-818 flow to the charge pump 800 via IOUTP, and return to the low side branches 820-836 from the charge pump 800 via IOUTN. Because the DOUT<7:0> signals are based on the VCO frequency, the charge pump currents similarly track the VCO operating frequency.

The example charge pump current generator 800 also generates reference currents IDRIVERP, IDRIVERN, IDRIVERPZ, IDRIVERNZ and IBOOTSTRAPP for the charge pump 800 via current branches 842-850.

The PNP transistors in the high side branches 802-818 and the NPN transistors in the low side branches 820-836 permit currents to flow based on the bias current IBP_50U_VBGR generated by the transistor 408 as described in FIG. 4. IBP_50U_VBGR adjusts a gate voltage of an n-type transistor 852, which controls the bias points of the NPN transistors of the low side branches 820-836 and 846-850, as well as for an additional NPN transistor 854. The NPN transistor 854 conducts a current, resulting in a gate voltage at a p-type transistor 856, which controls the bias points of the transistors in the high side branches 802-818 and 842-844.

Figure 9:
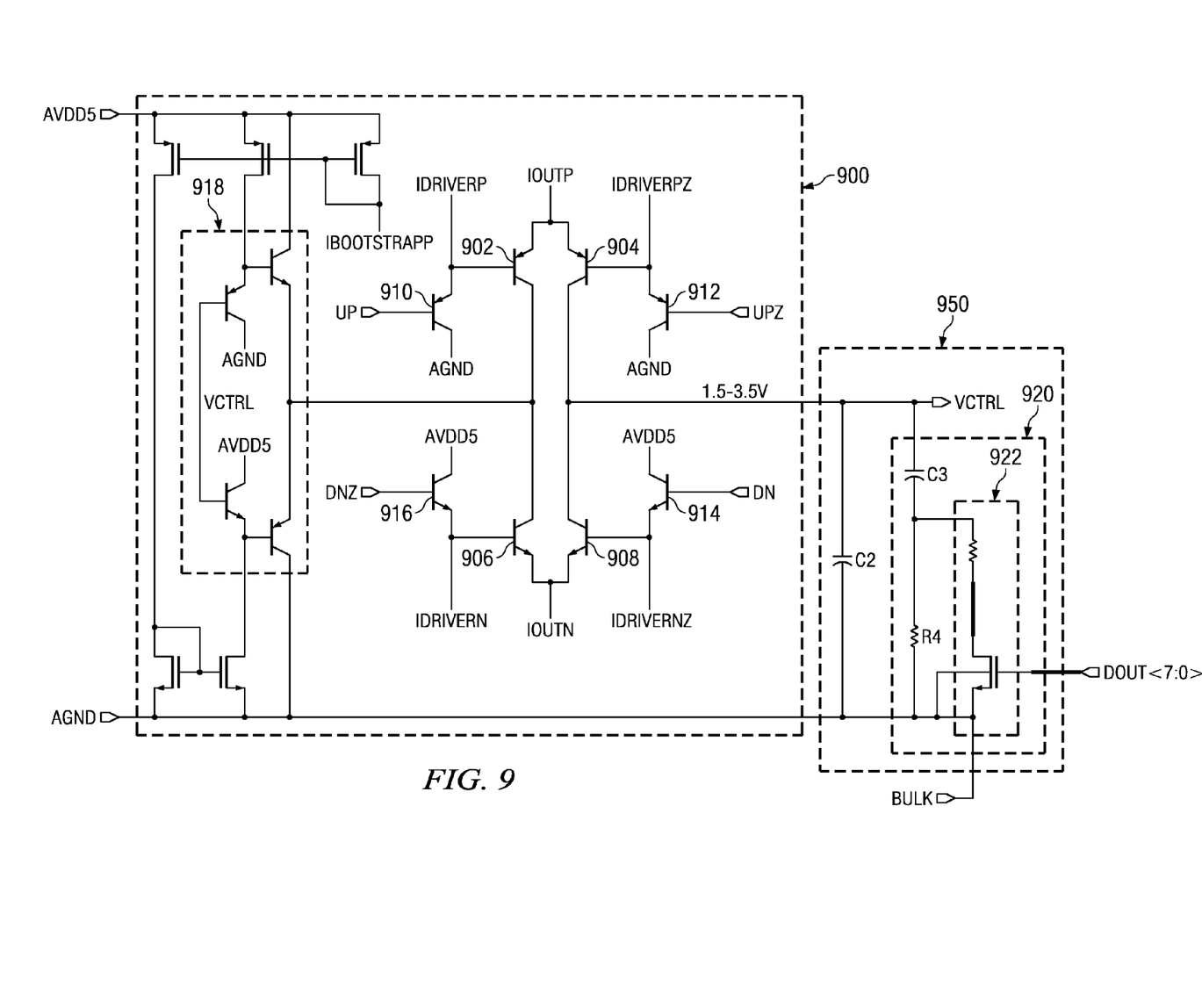
FIG. 9 is a schematic diagram of the example charge pump and loop filter circuit shown in FIG. 1.

FIG. 9 is a schematic diagram of the example charge pump 900 and loop filter circuits 950 shown in FIG. 1. The example charge pump 900 sources or sinks current to the loop filter 950 based on adjustment signals (e.g., UP/UPZ and DN/DNZ) received from the phase-frequency detector 110 of FIG. 1. The VCTRL signal is then sent to the VCO 102 of FIG. 1 to tune the oscillation frequency of the output clock. The IOUTP and IOUTN signals received from the current generator 800 of FIG. 8 provide currents for the charge pump 900, which are scaled according to the frequency of the output clock of the VCO 102.

The example UP and DN signals are active-high signals. Thus, when the frequency of the VCO 102 output clock must be increased, the UP signal increases in voltage and UPZ decreases in voltage. Similarly, when the frequency of the VCO 102 output clock must be decreased, the DN signal increases and the DNZ signal decreases. Based on the UP or DN signals, current flows to or from the loop filter 950 from the charge pump 900, increasing or decreasing VCTRL. VCTRL further controls a push-pull amplifier 918, which sources or sinks current from the charge pump 900.

Turning to an operational example, the UP signal is asserted high, UPZ is low, DN is low, and DNZ is high. The transistor 904 conducts current from IOUTP to the loop filter 950, increasing the voltage at VCTRL. The push-pull amplifier 918 sources current to the charge pump 900, which flows through the transistor 906 to IOUTN.

The loop filter 950 controls the bandwidth of the PLL 100 and filters out noise (e.g., switching transients) from VCTRL. The example loop filter 950 includes a capacitor C2 coupling VCTRL to AGND, and an RC filter 920 including a capacitor C3 and an adjustable resistance. The adjustable resistance utilizes a resistor R4 in parallel with resistance branches 922. Each resistance branch 922 includes a resistor and an n-type transistor, which is controlled at a corresponding gate terminal by the corresponding DOUT signal provided by the quantizer 104. If the DOUT signal for the particular branch 922 is at a logic high, the example branch 922 will conduct current, lowering the effective resistance of the RC filter 920 (i.e., lowering the time constant RC). In contrast, a logic low DOUT signal presents an effective open circuit for the corresponding branch 922, which does not lower the effective resistance of the RC filter 920.

As VCTRL increases and the output clocks of the example VCO 102 increase in frequency, a larger number of DOUT<7:0> signals become logic high signals, causing more branches 920 to conduct and lowering the effective resistance of the RC filter 918. As a result, the RC time constant of the RC filter 918 lowers as the frequency rises, which allows VCTRL to change more rapidly in response to higher frequencies. Thus, the loop filter 950 may increase and/or decrease the bandwidth as a function of frequency.

One of ordinary skill in the art can observe that IOUTP, IOUTN, and the loop filter 950 resistance increase and decrease together due to mutual dependence on the DOUT<7:0> signals. This effect provides constant or substantially constant damping factor over the frequency range of the output clock.

The example components shown in FIGS. 1-9 are implemented in one IC package. However, it is readily recognized that any or all components of the described examples may be implemented using discrete components, additional ICs, or any combination thereof.

Although certain apparatus have been described herein, the scope of coverage of this patent is not limited thereto. On the contrary, this patent covers all methods and apparatus fairly falling within the scope of the appended claims either literally or under the doctrine of equivalents.

What is claimed is:

1. An apparatus to provide a phase-locked loop (PLL) comprising:
 a voltage-controlled oscillator (VCO) to provide an output clock signal having a frequency based at least in part on a control voltage and to provide a plurality of output currents based at least in part on the control voltage;
 a quantizer to generate at least one digital signal based at least in part on at least one of the plurality of output currents; and
 a charge pump having a plurality of current paths to selectively increase or decrease current to the charge pump based at least in part on the at least one digital signal that is generated by the quantizer to modify the control voltage.

2. The apparatus of claim 1, wherein the VCO further comprises a plurality of ring-oscillator stages, wherein each ring-oscillator stage includes a plurality of gain stages to provide a plurality of output currents based on the control voltage and a plurality of threshold voltages.

3. The apparatus of claim 2, wherein each gain stage is configured to increase an output current associated with the corresponding ring-oscillator stage based on the control voltage and one of the threshold voltages.

4. The apparatus of claim 2, wherein at least one of the gain stages is configured to operate in linear mode based on the control voltage and one of the threshold voltages.

5. The apparatus of claim 1, wherein the apparatus further comprises a loop filter to control a bandwidth of the PLL based on the at least one digital signal.

6. The apparatus of claim 5, wherein the loop filter further comprises a resistor-capacitor (RC) filter and a plurality of switching elements to control a time constant associated with the RC filter.

7. The apparatus of claim 6, wherein the plurality of switching elements are configured to be controlled by the at least one digital signal.

8. The apparatus of claim 6, wherein the plurality of switching elements further comprises a plurality of n-type transistors, wherein each transistor includes a gate terminal coupled to a digital signal from the quantizer.

9. The apparatus of claim 8, wherein the digital signal causes the transistor to increase the bandwidth of the PLL by decreasing the time constant in response to the control voltage increasing.

10. The apparatus of claim 1, wherein the current paths are configured to increase current to the charge pump in response to an increase in the control voltage.

11. The apparatus of claim 1, wherein a number of active digital control signals is based on the control voltage.

12. An apparatus comprising:
 a VCO that generates an output clock signal having a frequency;
 a quantizer that is coupled to and controlled by the VCO;
 a charge pump that is coupled to the VCO so as to provide a control signal to the VCO based on at least in part on the frequency of the output clock signal of the VCO;
 a charge pump current generator that is coupled to the charge pump so as to selectively increase a current supply to the charge pump based at least in part on the frequency of the output clock signal of the VCO, wherein the charge pump current generator includes a plurality of current paths to be selectively actuated by the quantizer; and
 a loop filter that is coupled to the charge pump so as to control a bandwidth of the PLL by controlling the control signal, wherein the frequency of the VCO is responsive to the control signal.

13. The apparatus of claim 12, wherein the loop filter is configured to control the control signal by allowing the control signal to change more rapidly in response to an increasing frequency.

14. The apparatus of claim 12, wherein the loop filter further comprises a capacitor, a first resistor, and a plurality of switching elements.

15. The apparatus of claim 14, wherein the switching elements are configured to selectively decrease a time constant of the loop filter based on one or more digital signals indicative of the frequency of the VCO.

16. The apparatus of claim 15, wherein each switching element further comprises a transistor responsive to the digital signals, and a resistor coupled to the transistor.

17. The apparatus of claim 12, wherein each current path further comprises:
a switching transistor to enable or disable current flow through the current path based on the frequency of the VCO; and
a bias transistor to control an amount of current through the current path.

18. The apparatus of claim 17, wherein the switching transistor is responsive to a digital signal indicative of the frequency of the VCO.

19. The apparatus of claim 12, wherein at least one current path couples the charge pump to an input power terminal and at least one current path couples the charge pump to a reference terminal.

20. An apparatus comprising:
a VCO to provide an output clock signal based on a control voltage, wherein the VCO includes:
a plurality of ring-oscillator stages to generate an output voltage based on an input voltage, wherein each ring-oscillator stage comprises a plurality of gain stages to selectively generate a control current and an output current based on a comparison of the control voltage and a corresponding threshold voltage, and one gain stage to generate an output current; and
a resistor ladder to provide a plurality of threshold voltages;
a quantizer to generate digital control signals based on corresponding control currents from the gain stages, wherein the quantizer includes a plurality of current comparators corresponding to the plurality of control currents received;
a phase/frequency detector to generate digital adjustment signals based on a comparison of a reference clock and a feedback clock that is based on the VCO output clock;
a loop filter to adjust the control voltage to the VCO based on the digital control signals;
a charge pump to supply a charge pump current to the loop filter based on a charge pump source current and the digital adjustment signals from the phase/frequency detector; and
a charge pump current generator to generate the charge pump source current based on the digital control signals, wherein the charge pump current generator includes a plurality of switching elements to selectively increase the charge pump source current based on the digital control signals.

21. An apparatus comprising:
a phase/frequency detector that receives a reference signal and a feedback signal;
a charge pump that is coupled to the phase/frequency detector;
a loop filter that is coupled to the charge pump;
a VCO that is coupled to the loop filter, wherein the VCO generates an output signal;
a divider that is coupled to the VCO and the phase/frequency detector, wherein the divider generates the feedback signal at least in part from the output signal;
a quantizer that is coupled to the VCO, wherein the VCO controls the quantizer; and
a charge pump current generator that is coupled to the charge pump and the quantizer, wherein the charge pump provides a current to the charge pump, and wherein the magnitude of the current is controlled by the quantizer.

22. The apparatus of claim 21, wherein the VCO further comprises:
a ring oscillator having a plurality of stage, wherein ring oscillator provides a plurality of bias currents, and wherein each stage is coupled to the loop filter;
a resistor ladder that is coupled to each stage of the ring oscillator so at to provide at least one of a plurality of threshold voltages to each stage; and
a buffer that is coupled to the ring oscillator.

23. The apparatus of claim 22, wherein the quantizer further comprises a plurality of comparators, wherein each comparator receives and compares at least two of the bias currents from the ring oscillator.

24. The apparatus of claim 23, wherein the charge pump current generator further comprises a plurality of branches, wherein each branch is coupled to the charge pump and wherein each branch is coupled to at least one of the comparators from the quantizer.

25. The apparatus of claim 24, wherein each branch further comprises:
a MOS transistor that is coupled to a supply rail at its source and to at least one of the comparators at its gate;
a resistor that is coupled to the drain of the MOS transistor; and
a bipolar transistor that is coupled to the resistor at its emitter and the charge pump at its collector.

* * * * *